(12) United States Patent
Xu

(10) Patent No.: US 7,230,838 B2
(45) Date of Patent: Jun. 12, 2007

(54) ACTIVE DAMPING CONTROL FOR A SWITCH MODE POWER SUPPLY

(75) Inventor: Peng Xu, San Jose, CA (US)

(73) Assignee: Monolithic Power Systems, Inc., San Jose, CA (US)

(*) Notice: Subject to any disclaimer, the term of this patent is extended or adjusted under 35 U.S.C. 154(b) by 0 days.

(21) Appl. No.: 11/321,248

(22) Filed: Dec. 28, 2005

(65) Prior Publication Data

US 2006/0158127 A1    Jul. 20, 2006

Related U.S. Application Data

(60) Provisional application No. 60/639,739, filed on Dec. 28, 2004.

(51) Int. Cl.
*H02M 5/42* (2006.01)
*G05F 1/40* (2006.01)

(52) U.S. Cl. .............. 363/86; 323/282; 323/283; 323/285; 323/287; 363/86; 363/21.16; 363/127; 363/16

(58) Field of Classification Search ............ 363/86, 363/127, 21.16, 16, 95; 323/282–283, 285–287, 323/371
See application file for complete search history.

(56) References Cited

U.S. PATENT DOCUMENTS

| | | | |
|---|---|---|---|
| 5,546,300 A * | 8/1996 | Lee et al. ................. 363/132 |
| RE38,196 E * | 7/2003 | Vinciarelli et al. ........... 363/16 |
| 6,674,271 B2 * | 1/2004 | Choo et al. ................. 323/282 |
| 6,987,678 B2 * | 1/2006 | Giandalia et al. ............ 363/86 |

* cited by examiner

*Primary Examiner*—Tho Phan
*Assistant Examiner*—Chuc Tran
(74) *Attorney, Agent, or Firm*—Perkins Coie; Zhou Lu

(57) ABSTRACT

Methods and apparatus are disclosed for suppressing circuit noise due to parasitic elements in switch mode power supplies. The presented embodiments use actively controlled damping devices such as controllable resistors, current sources, and tri-state power devices to achieve required damping and to minimize power loss.

15 Claims, 11 Drawing Sheets

ACTIVE DAMPING CONTROL FOR A SWITCH MODE POWER SUPPLY

CROSS-REFERENCE TO RELATED APPLICATION(S)

This application claims the benefit of U.S. Provisional Patent Application No. 60/639,739, filed on Dec. 28, 2004.

TECHNICAL FIELD

The embodiments described below relate, in general, to switch mode power supplies and switching regulators, and in particular, to methods and apparatus for suppressing circuit noise due to parasitic elements.

BACKGROUND

Switch mode power supplies (SMPS), because of their high efficiency, are popular in powering electronic circuitry such as CPUs, DRAMs, and ASICs. In contrast to the power devices used in linear regulators, the power devices in the SMPS work as ON or OFF switching components. Thus, the conduction power loss is minimized. However, the switching actions of these power devices will typically cause undesirable high frequency oscillations due to at least one of the following reasons:
a. parasitic inductance in the circuit board layout and power device package;
b. parasitic capacitance inherent in the power switching devices; and
c. series resistance or inductance in the capacitors.

A SMPS typically consists of at least two switching devices, with the first device being actively controlled to regulate the output voltage. The first device is usually referred to as the "main switch." The second device is usually referred to as the "rectifier" that can be passively or actively controlled. One commonly observed high frequency oscillation is at the switching node of either of the power devices. Because this oscillation frequency is much higher than the normal switching frequency, the normally provided filter network of inductors and capacitors cannot suppress this ringing effectively. Consequently, the output may see high frequency ripples, resulting in possible electromagnetic interference (EMI) issues. In the prior art, a passive RC "snubber" is usually employed to suppress the ringing problem. Although somewhat effective, the RC snubber significantly increases the power loss.

The SMPS is popular in powering ASICs, DRAMs, and other electronic devices because of its high efficiency. The selection of the SMPS topology requires consideration of the relationship of the input and output voltages. One example is the portable devices such as digital cameras that use a single-cell Li-Ion battery to power a 3.3V rail, where the battery voltage is about 4.2V after charging up and drops to about 2.7V before the camera ceases to function. Appropriate efficiency is also required during the entire range of operation to maximize the battery usage life despite its limited size and weight. Such applications require SMPSs that can operate efficiently and automatically with input voltages that are above, below, or equal to the output voltage.

A "buck" converter can only be used if an input voltage remains higher than the output voltage. On the other hand, a "boost" converter may only be used if the input voltage stays less than the output voltage at all times. The well-known "buck-boost" converter can operate automatically from input voltages above, below, or equal to the output voltage, but cannot maintain a high efficiency over a wide range of input voltages. The buck-boost converter has a reasonable efficiency only when the input voltage is close to the output voltage, but it has much less efficiency than a buck converter when the input voltage is above the output voltage and much less than a boost converter when input voltage is below the output voltage.

DETAILED DESCRIPTION

The embodiments disclosed herein use actively controlled damping devices such as controllable resistors, current sources, and tri-state power devices to achieve proper damping and minimize power losses.

Various embodiments of the invention will now be described. The following description provides specific details for a thorough understanding and enabling description of these embodiments. One skilled in the art will understand, however, that the invention may be practiced without many of these details. Additionally, some well-known structures or functions may not be shown or described in detail, so as to avoid unnecessarily obscuring the relevant description of the various embodiments.

The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this Detailed Description section.

The description of the embodiments of the invention and their applications as set forth herein is illustrative and is not intended to limit the scope of the invention. Variations and modifications of the embodiments are possible and practical alternatives to, or equivalents of the various elements of, the embodiments disclosed herein and are known to those of ordinary skill in the art. Such variations and modifications of the disclosed embodiments may be made without departing from the scope and spirit of the invention.

In the following description, several specific details are presented to provide a thorough understanding of the embodiments of the invention. In particular, a buck circuit is used throughout the discussion. One skilled in the relevant art will recognize, however, that the invention can be practiced without one or more of the specific details, or in different circuit topologies including, but not limited to, boost, flyback, SPEIC, Zeta, forward, haL bridge, full bridge, pushpull, etc. In other instances, well-known implementations or operations are not shown or described in detail to avoid obscuring other aspects of various embodiments of the invention.

Figure 1A:
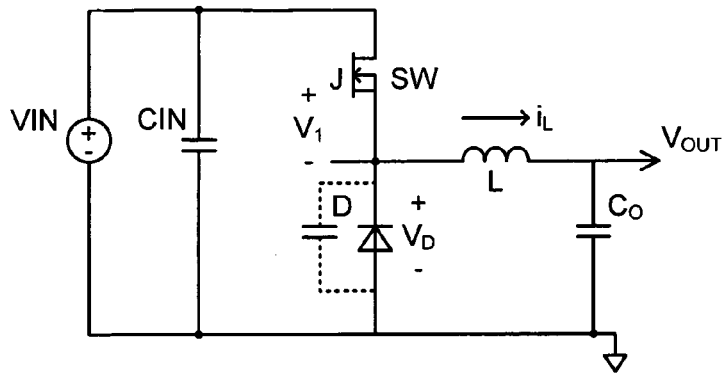
FIGS. 1A, 1B, and 1C show a schematic diagram of a buck circuit and two common ringings associated with the circuit.
Figure 1B:
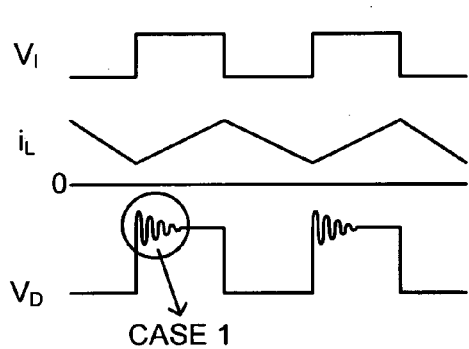

FIG. 1A shows a simplified prior art buck circuit and two commonly observed parasitic ringings. When the main (top) switch SW1 in the buck circuit turns ON, the equivalent parasitic inductance in the loop area formed by SW1, rectifier D and input cap $C_{IN}$ resonates with the equivalent parasitic capacitance across D. This ringing can cause the switch node N to overshoot $V_{IN}$ by a large margin, resulting in a high output switching spike and possible breakdown of the rectifier D. This ringing has a very high frequency and can show up at the output as switching spikes. This phenomenon is seen in waveform of FIG. 1B. This is referred to as Case-1 ringing.

Figure 1C:
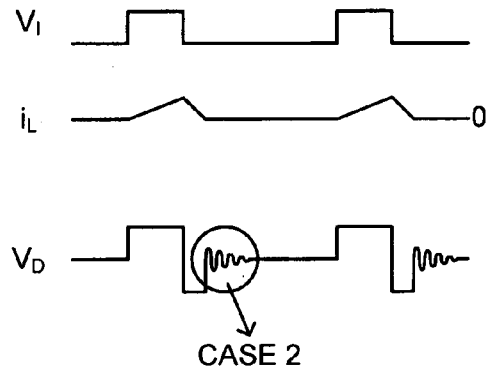
Figure 2:
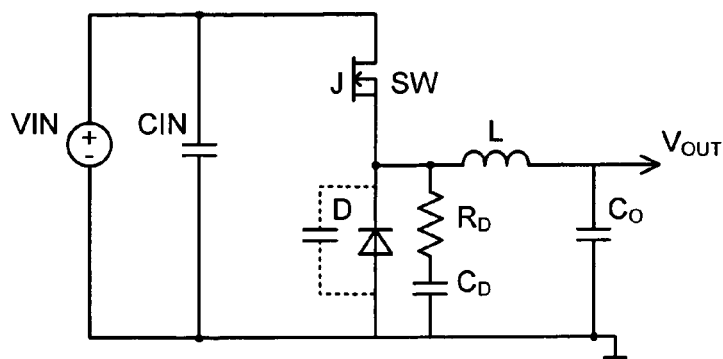
FIG. 2 shows a prior art RC snubbing scheme to suppress some parasitic ringings.

The second parasitic ringing, referred to as Case-2 ringing, takes place at light load conditions immediately after the inductor current becomes "discontinuous", as shown in FIG. 1C. In this case, the output filter inductor L resonates with the parasitic capacitance across D. FIG. 2 shows a prior art RC snubbing scheme to suppress these parasitic ringings.

Figure 3:
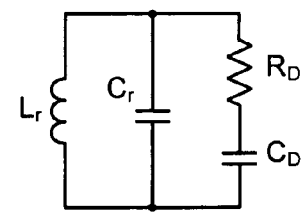
FIG. 3 illustrates that an equivalent circuit for parasitic ringing is a $2^{nd}$ order system consisting of $L_r$ and $C_r$.

FIG. 3 illustrates an equivalent circuit for the parasitic ringing, which is a $2^{nd}$ order system consisting of inductor $L_r$ and capacitor $C_r$. $L_r$ is the total leakage inductance in the loop formed by SW1, D, and $C_{IN}$ in Case-1, and the output inductor L in Case-2. $C_r$ is the equivalent parasitic capacitance across D. To dampen the oscillation across $C_r$, it is desirable to have a parallel RC snubbing network across D (or $C_r$). $R_D$ is usually chosen to be no larger than $\sqrt{L_r/C_r}$, and $C_D$ is used to block the DC current into $R_D$ to reduce the conduction loss.

Empirically, $C_D$ is chosen to be at least 3 times larger than $C_r$ so that $R_D$ can effectively damp the ringing. A larger $C_r$ or smaller $R_D$ will make the damping more effective, but will also increase the power loss. Because node N is switching, $C_D$ is discharged and charged in every cycle, resulting in an unnecessary power loss. And, since the equivalent parasitic inductance $L_r$ is different in the two cases, it is difficult to optimize the $R_D$ for a range of operation.

Figure 4:
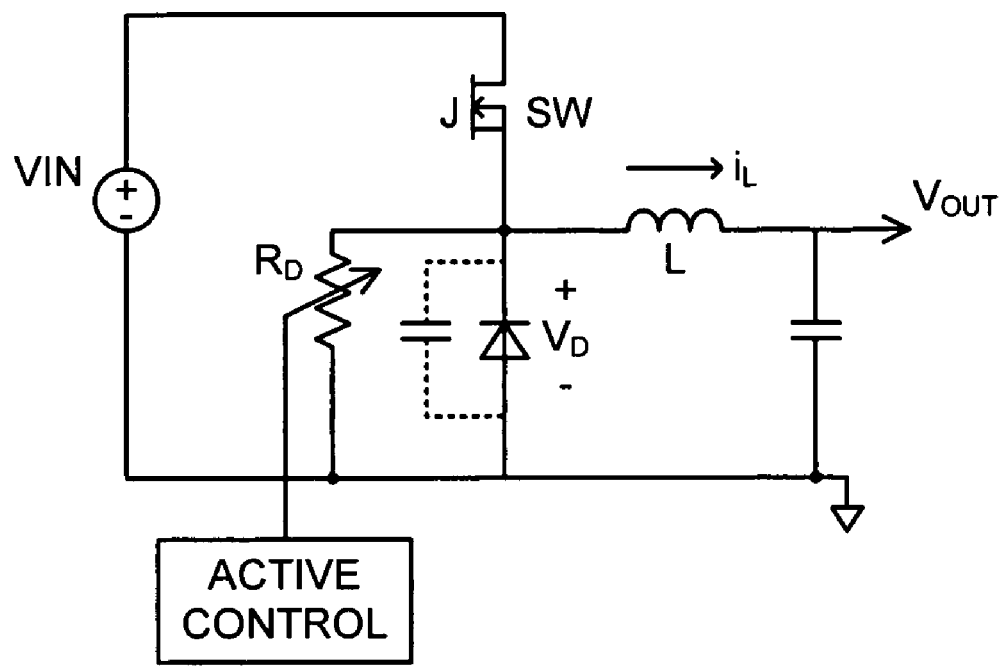
FIG. 4 illustrates a scheme in accordance with an embodiment of the present invention using an active damping resistor in a regular buck circuit to suppress the ringing.

FIG. 4 illustrates a scheme in accordance with an embodiment of the present invention that uses an active damping resistor in a regular buck circuit to suppress the ringing. $R_D$ is placed in parallel with the main switch SW1 or rectifier D. $R_D$ is controlled such that:

a. $R_D$ is infinity (open circuit) when the main switch SW1 is ON; and b. $R_D$ is variable to minimize the amplitude and settling time of the ringings for Case-1 and/or Case-2 when D is OFF.

$R_D$ can be controlled by monitoring the switch node N waveforms, or by measuring the inductor L current, or by pre-programming $R_D$ values to maximize the damping effects and to minimize the additional power losses during normal operation. Ideally, $R_D$ is smaller at the beginning of the ringing to maximize the damping effect, and larger near the end of ringing to minimize the additional power losses. In the case where $R_D$ is parallel with the main switch SW1, the main switch SW1 can be driven into the linear region to implement an active damping device to suppress the Case-2 ringing.

For high output current or low output voltage applications, it is desirable to use a low conduction drop controllable power semiconductor device (referred to in the art as a synchronous rectifier) to replace the "regular" rectifier. In the disclosed embodiments the synchronous rectifier can be used as both the regular synchronous switch and the active damping resistor.

Figure 5:
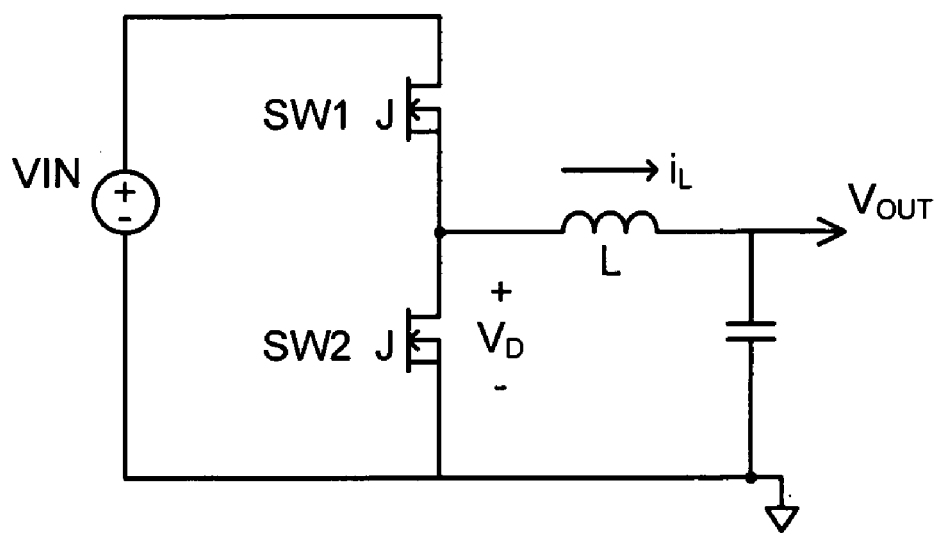
FIG. 5 shows a schematic diagram for a simplified synchronous buck circuit in accordance with another embodiment of the present invention.

FIG. 5 shows the schematic diagram for a synchronous buck circuit in accordance with another embodiment of the invention. In this application, the main switch SW1 can also be used as the active damping resistor, as described previously.

Note that each power semiconductor device has three operational regions (or modes): ON, OFF, and linear. In the ON stage, the power semiconductor device has the minimum impedance and has the minimum conduction power loss. In the OFF stage, the power device conducts no current. In the linear stage, the power device has a resistance that is at least ten times that of the ON stage.

Figure 6A:
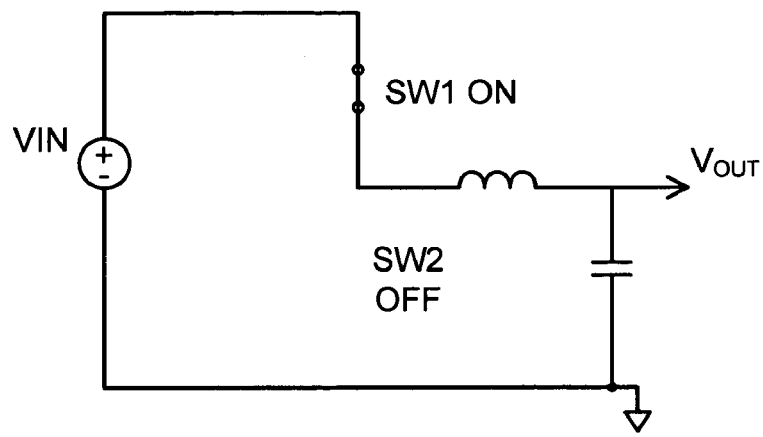
FIG. 6A to 6C shows working stages of an embodiment of the invention in a synchronous buck circuit.
Figure 6B:
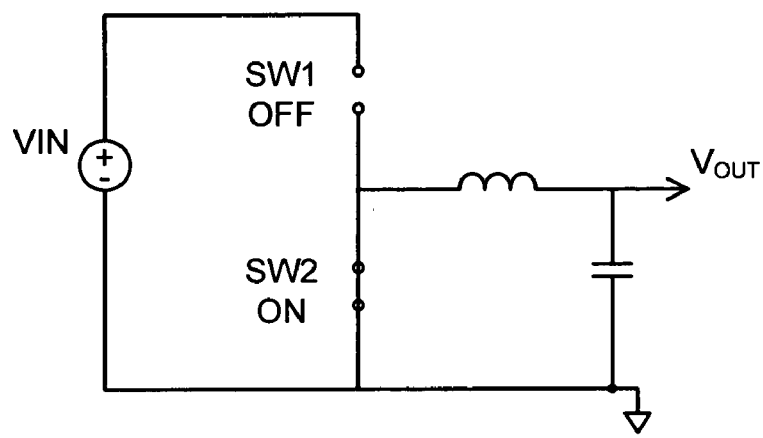
Figure 6C:
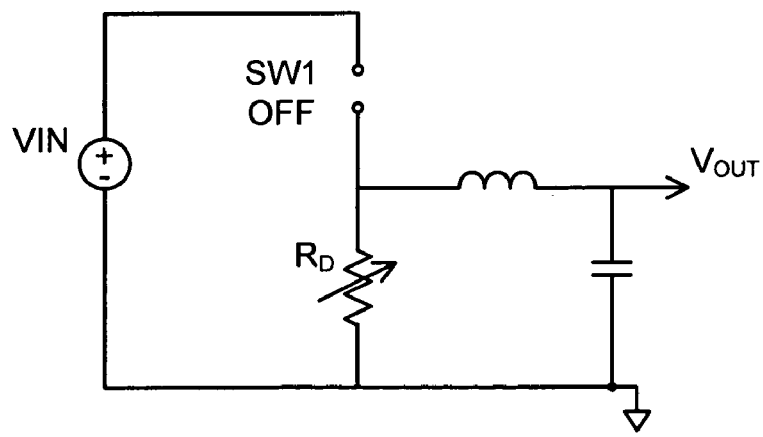

FIG. 6 shows an embodiment of a synchronous buck circuit at three operational stages at light loads—to suppress the Case-2 ringing:

a. Main switch SW1 is ON, synchronous switch SW2 is OFF. Inductor L current increases.

b. Main switch SW1 is OFF, SW2 is ON. Inductor L current decreases.

c. After the inductor L current crosses zero or becomes negative, SW2 transitions from the ON state into the linear state, thus providing a resistance that is much higher than the normal ON state resistance, but lower than the OFF resistance. This resistance can be either preset or modulated to suppress the ringing. In one embodiment, there is a lower linear resistance at the beginning of the Case-2 ringing and higher resistance at the end of ringing.

Figure 7A:
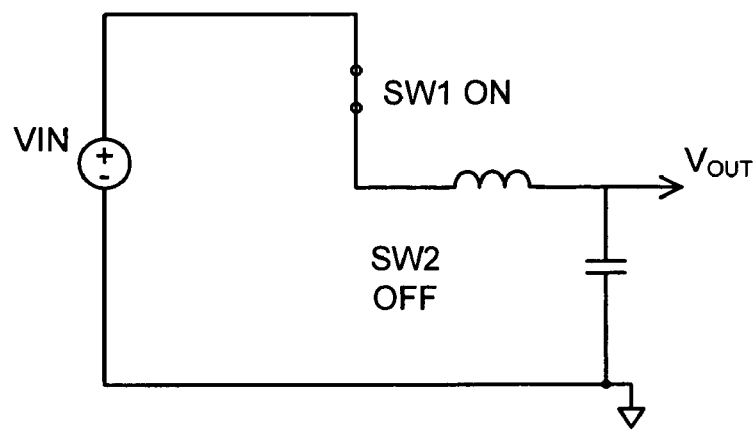
FIG. 7A to 7C shows different working stages of an embodiment of the invention in a synchronous buck circuit.
Figure 7B:
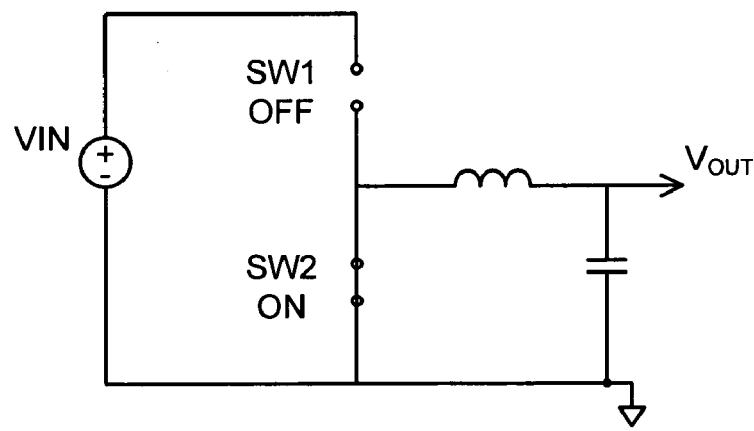
Figure 7C:
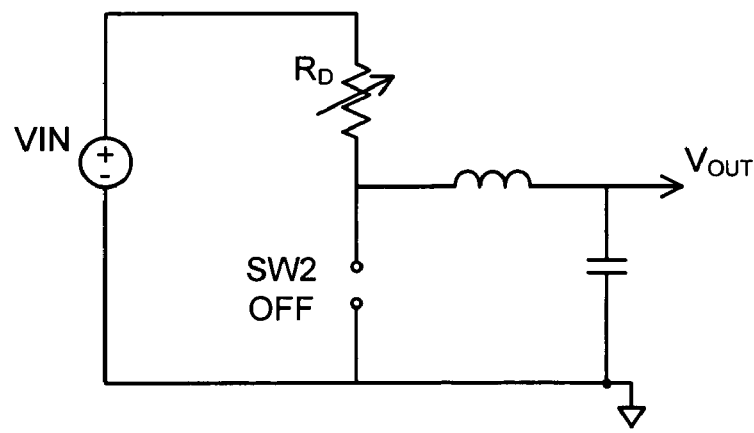

FIG. 7 shows an example of another implementation of a synchronous buck circuit with three operational stages at light loads—to suppress Case-2 ringing:

a. Main switch SW1 is ON, synchronous switch SW2 is OFF. Inductor L current increases.

b. Main switch SW1 is OFF, SW2 is ON. Inductor L current decreases.

c. After inductor L current crosses zero or becomes negative, SW2 turns off and SW1 transitions from the OFF state into the linear state, thus providing a resistance that is much higher than the normal ON-state resistance, but lower than the OFF resistance. This resistance can be either preset or modulated to suppress the ringing. In one embodiment, there is a lower linear resistance at the beginning of the Case-2 ringing and higher resistance at the end of ringing.

Figure 8:
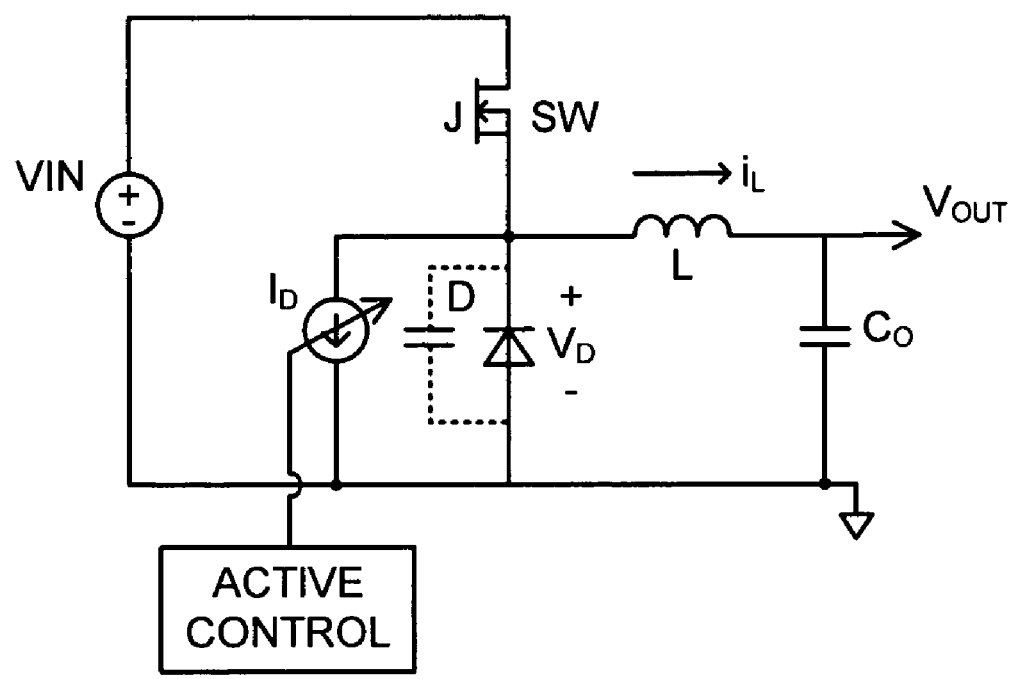
FIG. 8 shows a scheme using an active damping current source in a regular buck circuit to suppress the ringing, in accordance with yet another embodiment of the present invention.

FIG. 8 shows a scheme according to another embodiment of the invention using an active damping current source in a regular buck circuit to suppress the ringing. Current source $I_d$ can be placed in parallel with switch SW1 or with rectifier D. $I_d$ is controlled such that:

a. $I_d$ is zero when main switch SW1 is ON; and
b. $I_d$ can be variable to minimize the amplitude and settling time of the ringings for Case-1 and/or Case-2 when D is OFF.

The current source $I_d$ can be controlled by monitoring the switch node N waveforms, or by measuring inductor L current, or by pre-programming the $I_d$ values to maximize the damping effects and to minimize the additional power losses during normal operation. $I_d$ is generally smaller at the beginning of the ringing to maximize the damping effect, and larger near the end of ringing to minimize the additional power loss. In the case where $I_d$ is parallel with the main switch SW1, the main switch SW1 can be driven into the linear region to implement the active damping device to suppress the Case-2 ringing.

For high output current or low output voltage applications, it is desirable to use a synchronous rectifier to replace the regular rectifier. Like above, the synchronous rectifier can be both the regular synchronous switch and the active damping current source.

Figure 9:
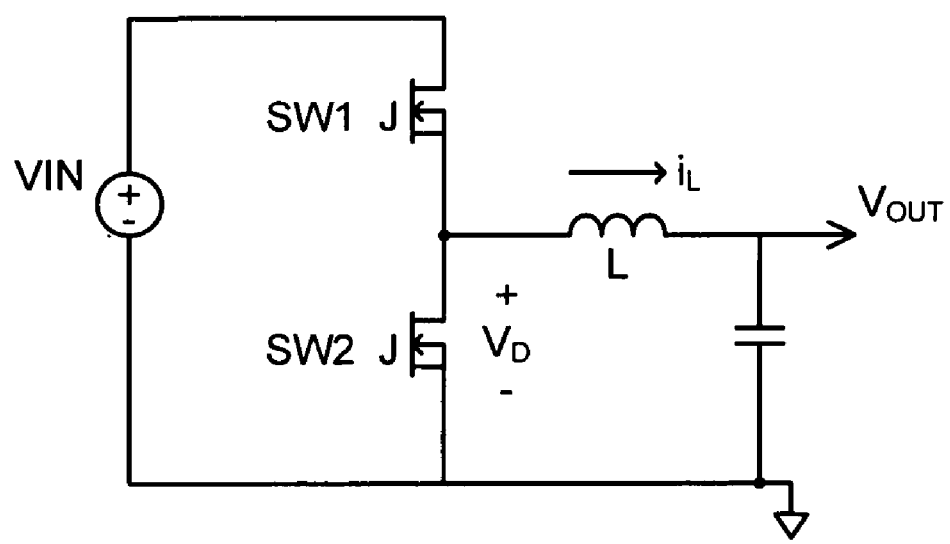
FIG. 9 shows a schematic diagram for a simplified synchronous buck circuit, in accordance with yet another embodiment of the present invention.

FIG. 9 shows a schematic diagram for a simplified synchronous buck circuit. In this application, the main switch SW1 can also be used as the active damping current source, as described previously.

Figure 10A:
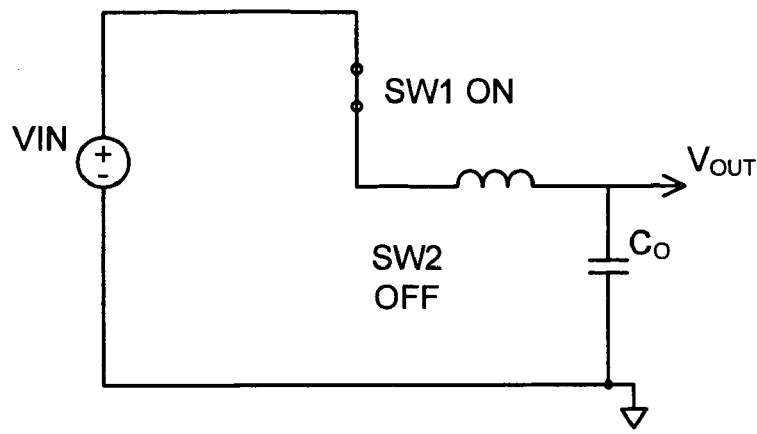
FIG. 10A to 10C shows working stages of an embodiment of active damping scheme in a synchronous buck circuit.
Figure 10B:
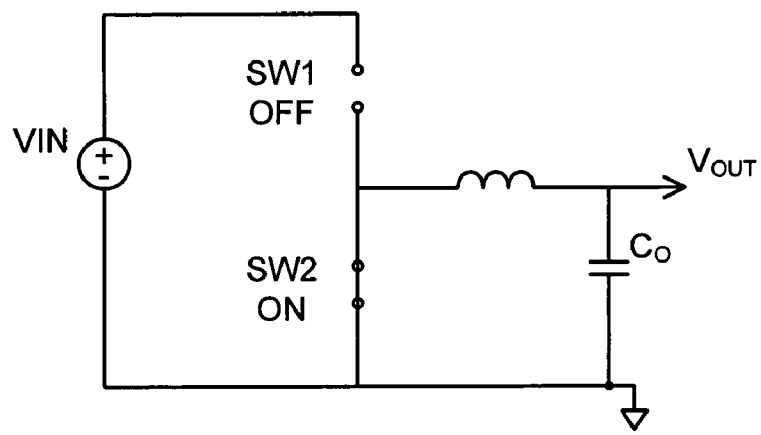
Figure 10C:
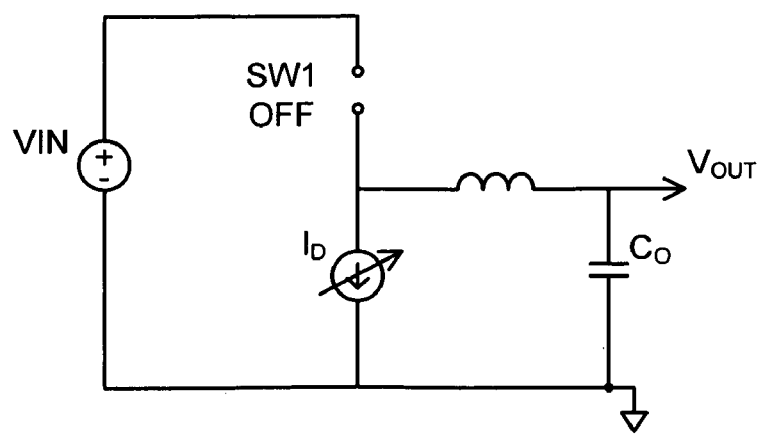

FIG. 10 shows an embodiment of active damping scheme in a synchronous buck circuit with three operation stages at light loads to suppress Case-2 ringing:

a. Main switch SW1 is ON, synchronous switch SW2 is OFF. Inductor L current increases.
b. Main switch SW1 is OFF, SW2 is ON. Inductor L current decreases.
c. After inductor L current crosses zero or becomes negative, SW2 transitions from an ON stage into the linear stage, thus passing a current that is much lower than the normal ON-state current, but higher than the OFF current. The level of this current source can be either preset or modulated to suppress the ringing. It is preferred to have higher current level at the beginning of the Case-2 ringing and lower current level at the end of ringing.

Figure 11A:
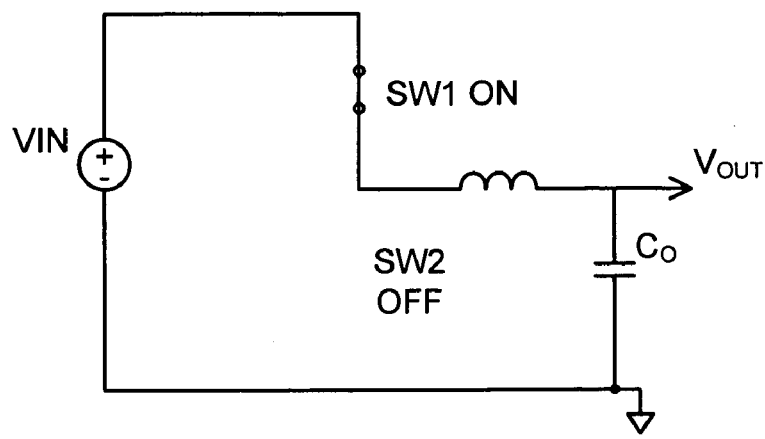
FIG. 11A to 11C shows different working stages of an embodiment of active damping scheme in a synchronous buck circuit.
Figure 11B:
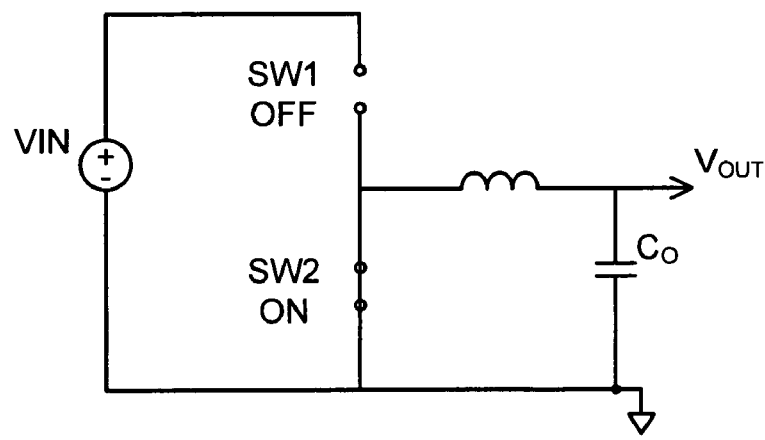
Figure 11C:
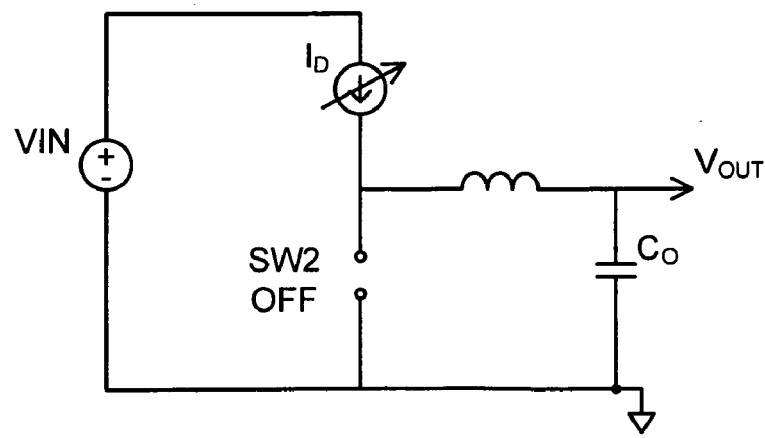

FIG. 11 shows another embodiment of the active damping scheme in a synchronous buck circuit with three operational stages at light loads to suppress Case-2 ringing:

a. Main switch SW1 is ON, synchronous switch SW2 is OFF. Inductor L current increases.
b. SW1 is OFF, SW2 is ON. Inductor L current decreases.
c. After inductor L current crosses zero or becomes negative, SW2 turns off and SW1 transitions from OFF stage into the linear stage, thus providing a current that is much lower the normal ON-state current, but higher than the OFF current. The level of this current source can be either preset or modulated to suppress the ringing. It is preferred to have higher current level at the beginning of the Case-2 ringing and lower current level at the end of ringing.

Figure 12:
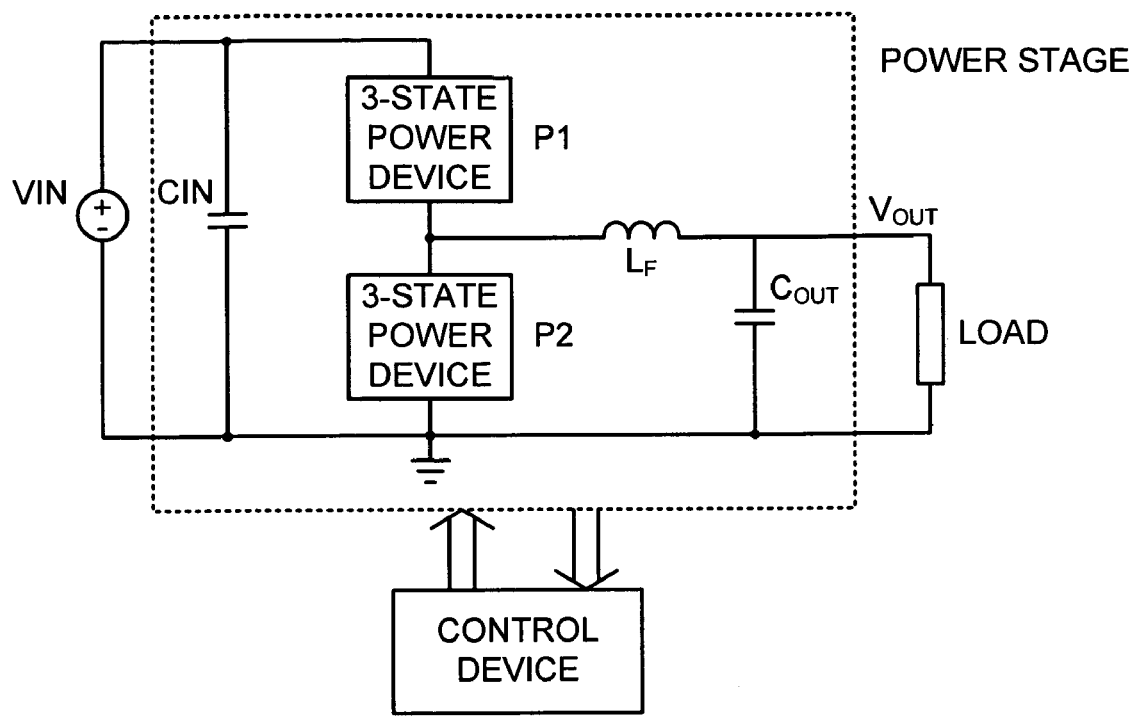
FIG. 12 shows a block diagram of a step down converter formed in accordance with another embodiment of the present invention.
Figure 13A:
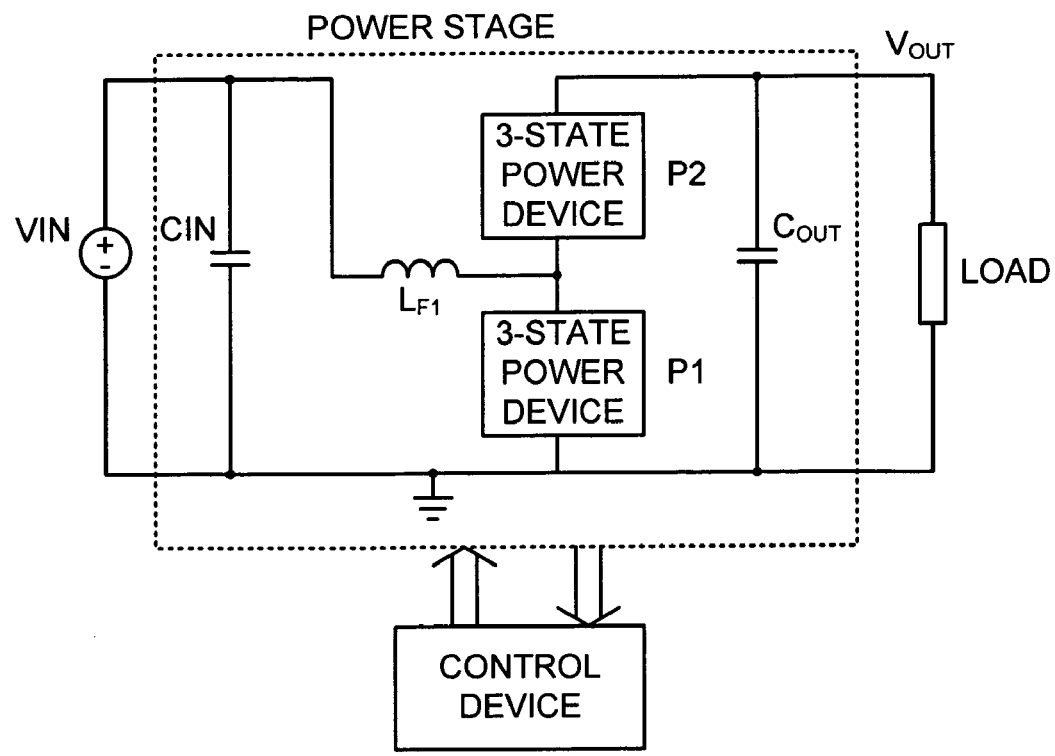
FIGS. 13A to 13E shows examples of applying aspects of the present invention to different topologies.
Figure 13B:
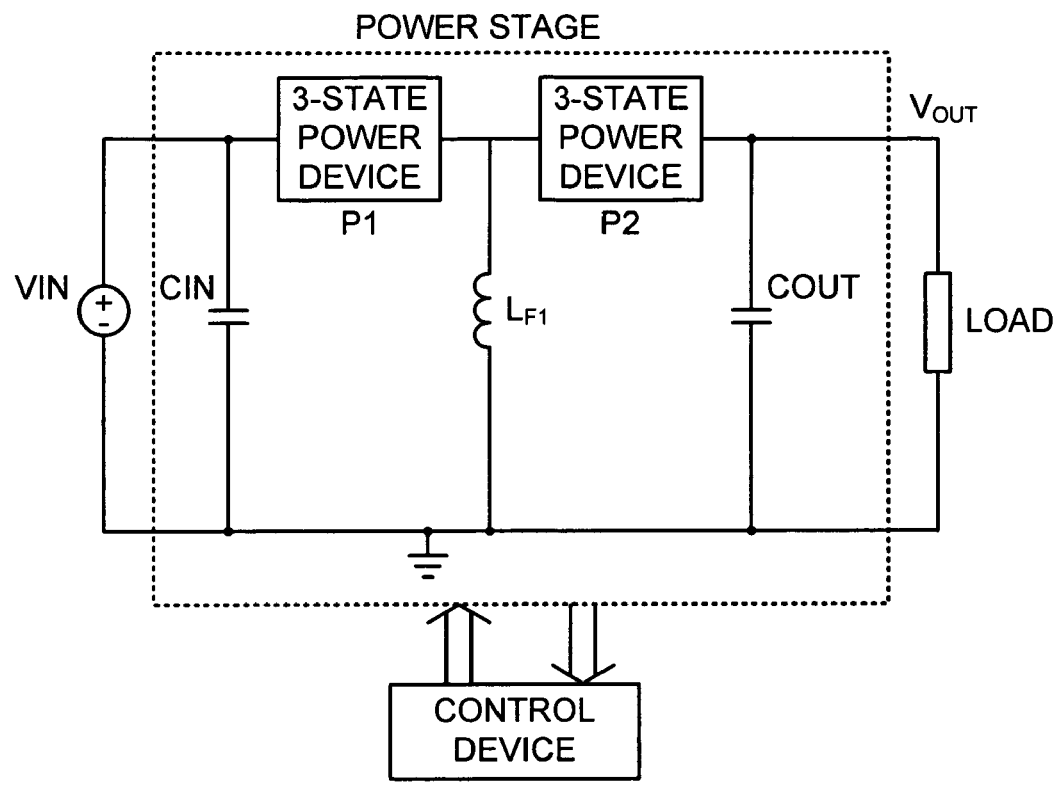
Figure 13C:
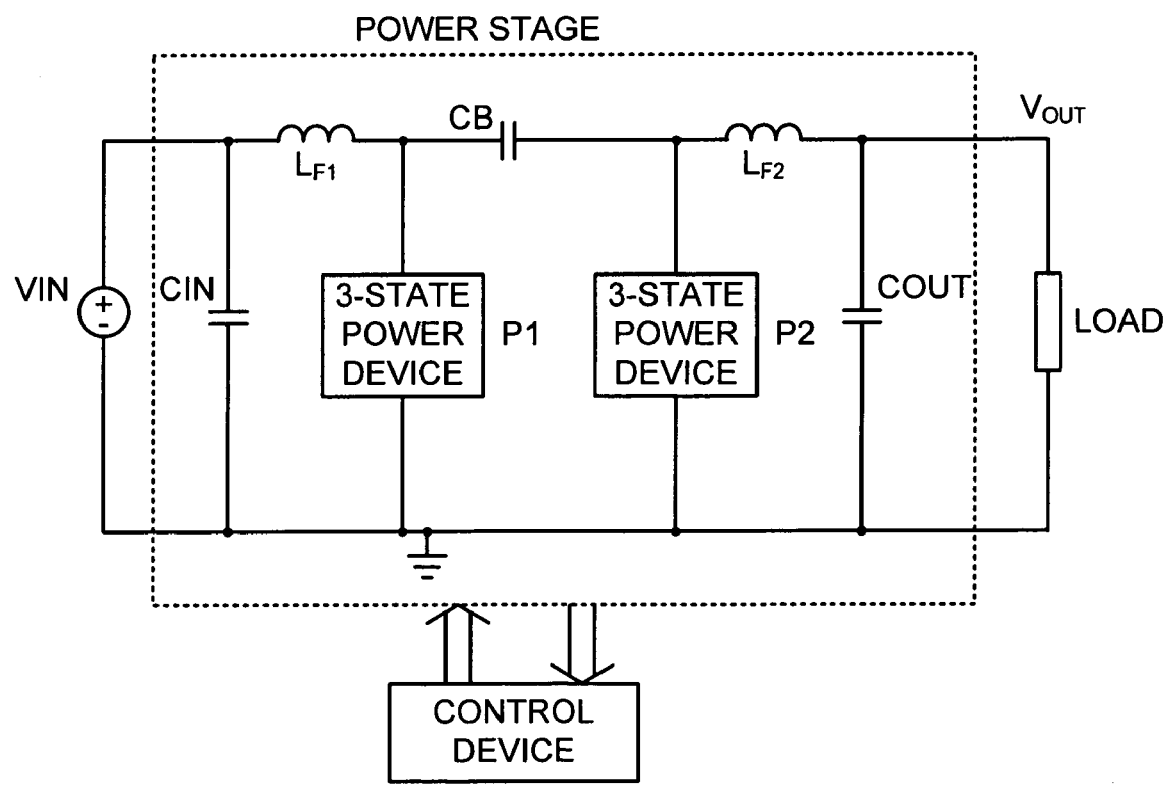
Figure 13D:
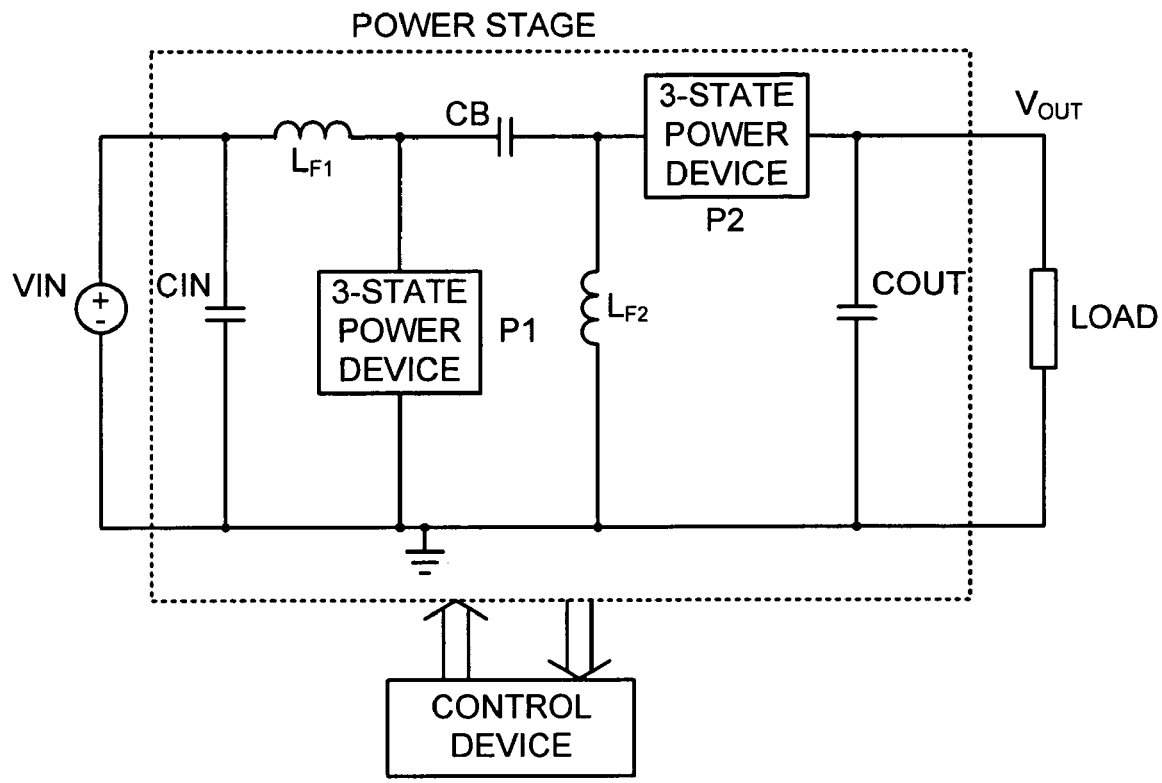
Figure 13E:
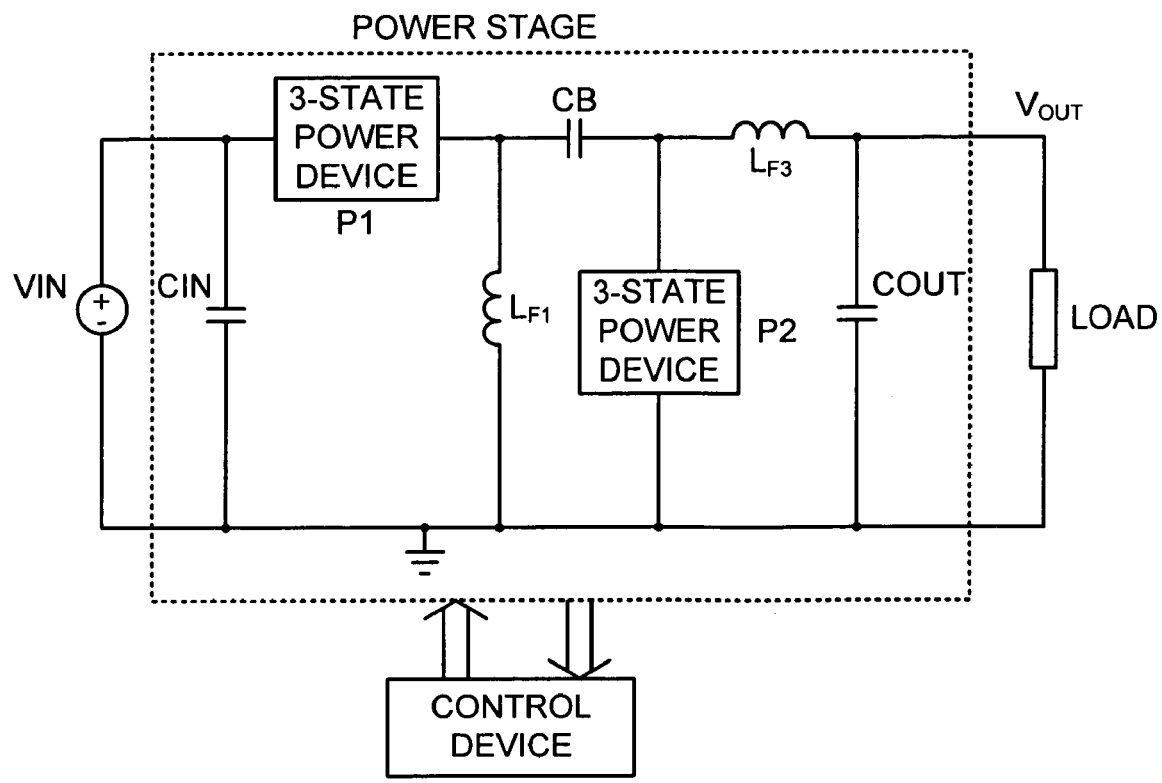

FIG. 12 shows a block diagram of a step down converter formed in accordance with an embodiment of the invention. Both power devices P1 and P2 can perform as the switching devices and as the active damping components, and at least one of these devices can work in all three regions: (1) ON, (2) OFF and (3) linear region. P1 and P2 take turns to change the operation state of the circuit to drive the inductor. Note that P1 and P2 are not ON at the same time.

Figure 15:
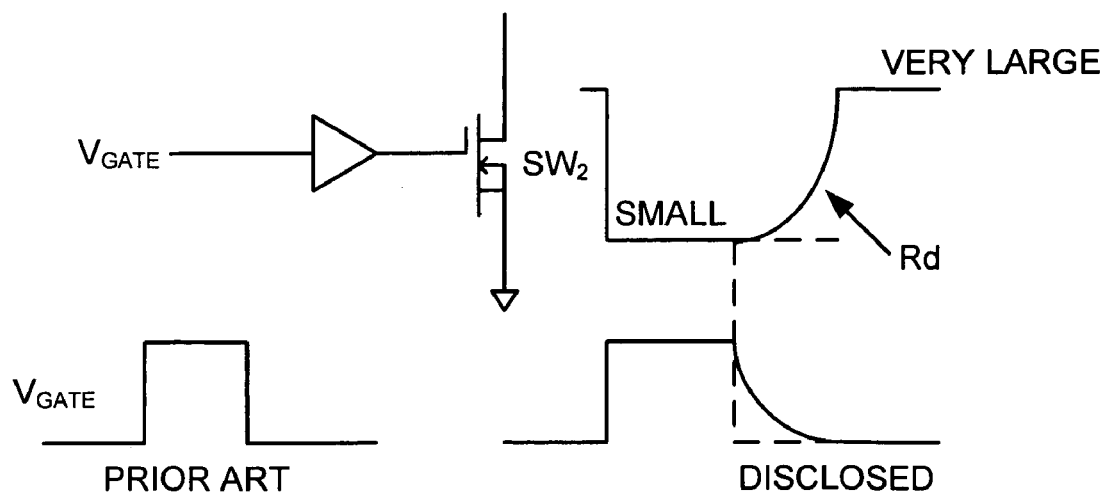
FIG. 15 shows a prior art gate voltage and an example of a disclosed controlled gate voltage and its effect on a switch output in accordance with an embodiment of the present invention.

A control circuit actively controls the operation state of P1 to modulate the output voltage based on its output voltage feedback. The control circuit also detects the circuit operation states, in particular, the states causing the parasitic ringings, to drive P1 or P2 into the linear region to actively damp the ringing. As a result, the proposed circuit can achieve the lowest possible noises level with low power loss. FIG. 15 shows an example of a gate voltage control and its effect on a switch output, to damp ringing.

FIG. 13 shows examples of applying aspects of the present invention to different topologies.

Figure 14:
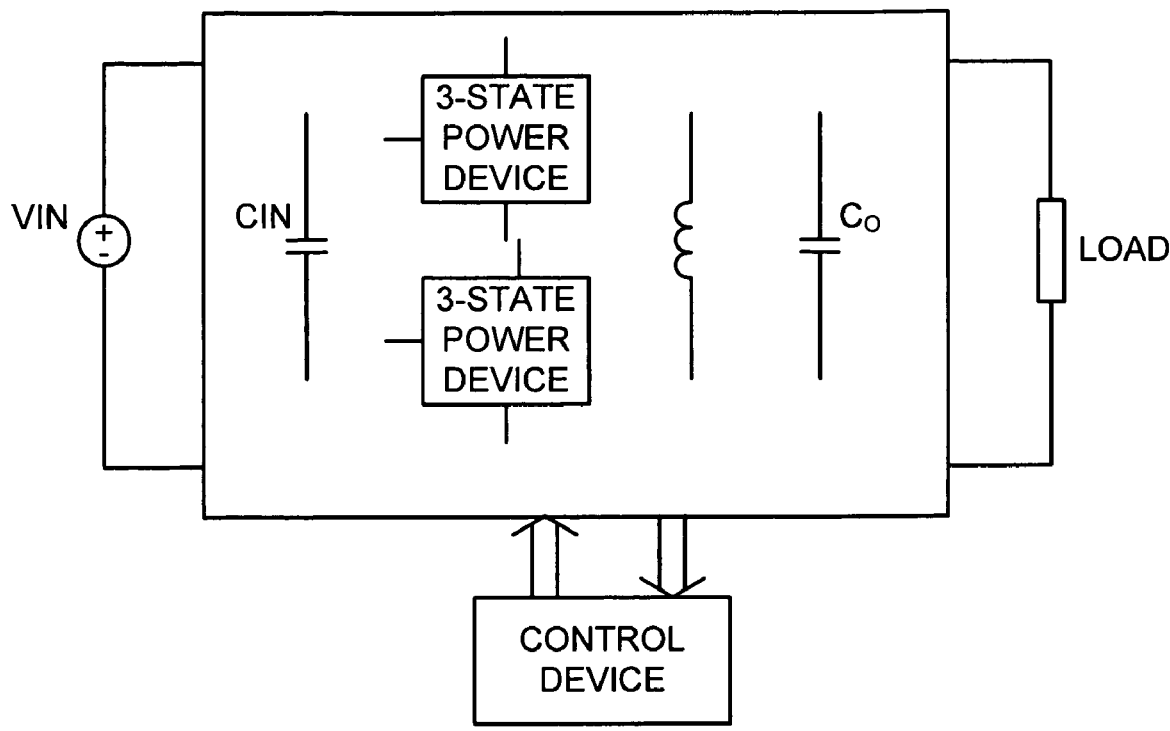
FIG. 14 shows a generalized circuit based on embodiments of the present invention.

FIG. 14 shows a generalized circuit based on some aspects of the present invention. In summary, the circuit includes a power stage with two tri-state power semiconductor devices, with at least one device operating in tri-state, at least one inductor, one input capacitor and one output capacitor, and the control device. The control device receives the feedback from the power stage and generates control signals to drive at least one of the power semiconductor devices to modulate the output voltage and to minimize the circuit noise and power loss.

FIG. 15 shows a prior art gate voltage and an example of a disclosed controlled gate voltage and its effect on a switch output in accordance with an embodiment of the present invention.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof.

Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize.

The teachings of the invention provided herein can be applied to other systems, not necessarily the system described above. The elements and acts of the various embodiments described above can be combined to provide further embodiments.

Changes can be made to the invention in light of the above Detailed Description. While the above description describes certain embodiments of the invention, and describes the best mode contemplated, no matter how detailed the above appears in text, the invention can be practiced in many ways. Details of the compensation system described above may vary considerably in its implementation details, while still being encompassed by the invention disclosed herein.

As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

I claim:

1. A switch mode power supply (SMPS) using an actively controlled damping device for suppressing circuit noise and ringing due to parasitic elements, the SMPS comprising:
   a first and a second input voltage port for connecting an input voltage to the SMPS;
   a first and a second output voltage port for connecting a load to a regulated output voltage of the SMPS, wherein an output capacitor is connected between the first and the second output voltage ports;
   an output inductor, wherein a second side of the output inductor is connected to the first output voltage port;
   a switch SW, connected from a first side to the first input voltage port and connected from a second side to a first side of the output inductor;
   a rectifier connected from a first side to the second side of the switch SW and connected from a second side to the second input voltage port and the second output voltage port; and
   a controllable resistor connected between the first and second sides of switch SW or between the first and second sides of the rectifier, wherein the controllable resistor is controlled such that:
      the controllable resistor is substantially large (open circuit) when SW is ON; and
      the controllable resistor is varied to minimize amplitudes and settling times of ringing when SW is OFF.

2. The switch mode power supply of claim 1, wherein the controllable resistor is controlled by monitoring waveforms at the second side of switch SW, by measuring output inductor current, or by pre-programming the controllable resistor values to maximize damping effects and minimize power losses during normal operation.

3. The switch mode power supply of claim 2, wherein the controllable resistor is smaller at the beginning of the ringing to maximize the damping effect, and larger near the end of ringing to minimize the additional power loss, and wherein if the controllable resistor is in parallel with switch SW, the switch SW is driven into a linear region to suppress the ringing.

4. The switch mode power supply of claim 1, wherein for high output current or low output voltage applications a low conduction drop controllable power semiconductor device (synchronous rectifier) is employed as the rectifier.

5. The switch mode power supply of claim 4, wherein the synchronous rectifier is used as a regular synchronous switch and as an active damping resistor.

6. The switch mode power supply of claim 1, wherein the rectifier and the controllable resistor connected to the rectifier in parallel are replaced by a synchronous switch SS.

7. The switch mode power supply of claim 6, wherein at light loads SW and SS are controlled as follow:
   SW is ON and SS is OFF to increase output inductor current;
   SW is OFF and SS is ON to decrease output inductor current; and
   after the output inductor current crosses zero or becomes negative, SS transitions from ON-state to linear state, to provide a higher resistance than normal ON-state resistance but lower than OFF resistance.

8. The switch mode power supply of claim 7, wherein the controllable resistor is either preset or modulated to suppress the ringing, with resistance lower at the beginning of the ringing and higher at the end of the ringing.

9. The switch mode power supply of claim 1, wherein at light loads SW and SS are controlled as follow:
   SW is ON and SS is OFF to increase output inductor current;
   SW is OFF and SS is ON to decrease output inductor current; and
   after the output inductor current crosses zero or becomes negative, SS turns OFF and SW transitions from OFF-state to linear state, to provide a higher resistance than normal ON-state resistance but lower than OFF resistance.

10. The switch mode power supply of claim 1, wherein the controllable resistor is replaced by a current source $I_d$, and wherein the current source $I_d$ is controlled such that:
    $I_d$ is substantially zero when SW is ON; and
    $I_d$ is varied to minimize amplitudes and settling times of the ringings when SW is OFF.

11. The switch mode power supply of claim 10, wherein for high output current or low output voltage applications a synchronous rectifier is used for the rectifier.

12. The switch mode power supply of claim 10, wherein the current source $I_d$ is controlled by monitoring waveforms of the second side of SW, by measuring output inductor current, or by pre-programming the $I_d$ values to maximize damping effects and to minimize additional power losses during normal operation, and wherein if $I_d$ is in parallel with SW, then SW is driven into a linear region to implement an active damping device to suppress the ringing.

13. The switch mode power supply of claim 10, wherein at light loads SW and SS are controlled as follow:
    SW is ON and SS is OFF to increase output inductor current;
    SW is OFF and SS is ON to decrease output inductor current; and
    after the output inductor current crosses zero or becomes negative, SS transitions from ON-stage to linear stage, to pass a current lower than normal ON-stage current but higher than OFF current.

14. The switch mode power supply of claim 10, wherein at light loads SW and SS are controlled as follow:
SW is ON and SS is OFF to increase output inductor current;
SW is OFF and SS is ON to decrease output inductor current; and
after the output inductor current crosses zero or becomes negative, SS turns OFF and SW transitions from OFF-stage to linear stage, to pass a current lower than normal ON-stage current but higher than OFF current.

15. The switch mode power supply of claim 1, wherein the second output voltage port is grounded.

* * * * *